(12) United States Patent
Orban

(10) Patent No.: US 6,337,999 B1
(45) Date of Patent: *Jan. 8, 2002

(54) OVERSAMPLED DIFFERENTIAL CLIPPER

(75) Inventor: Robert A. Orban, Belmont, CA (US)

(73) Assignee: Orban, Inc., San Leandro, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/216,356

(22) Filed: Dec. 18, 1998

(51) Int. Cl.[7] ............................. G06F 17/00; H03G 7/00
(52) U.S. Cl. ......................... 700/94; 381/106; 708/313
(58) Field of Search ................................. 381/106, 107, 381/108, 100, 101, 102, 104, 98, 94.2, 94.5, 94.8; 333/14, 28 T; 455/72; 700/94; 708/313

(56) References Cited

U.S. PATENT DOCUMENTS

| 4,020,332 A | * | 4/1977 | Crochiere et al. | 235/152 |
|---|---|---|---|---|
| 4,208,548 A | | 6/1980 | Orban | |
| 4,292,042 A | | 9/1981 | Kimble | |
| 4,412,100 A | | 10/1983 | Orban | |
| 4,472,785 A | * | 9/1984 | Kasuga | 708/313 |
| 4,640,871 A | | 2/1987 | Hayashi et al. | |
| 4,870,682 A | * | 9/1989 | Morrey et al. | 380/46 |
| 4,949,177 A | * | 8/1990 | Bannister et al. | 358/138 |
| 5,168,526 A | | 12/1992 | Orban | |
| 5,355,328 A | * | 10/1994 | Arbeiter et al. | 708/313 |
| 5,432,716 A | * | 7/1995 | Lebowsky et al. | 364/572 |
| 5,444,788 A | * | 8/1995 | Orban | 381/106 |
| 5,461,340 A | * | 10/1995 | Chahabadi et al. | 329/349 |
| 5,488,374 A | | 1/1996 | Frankot et al. | |
| 5,574,791 A | | 11/1996 | Orban | |
| 5,579,404 A | * | 11/1996 | Fielder et al. | 381/101 |
| 5,631,969 A | | 5/1997 | Hanson | |
| 5,734,438 A | * | 3/1998 | Into | 348/590 |
| 5,737,432 A | * | 4/1998 | Werrbach | 281/94 |
| 5,737,434 A | | 4/1998 | Orban | |
| 5,757,931 A | * | 5/1998 | Yamada et al. | 381/61 |
| 5,767,900 A | * | 6/1998 | Tanji et al. | 348/253 |
| 5,805,715 A | * | 9/1998 | Rhee | 381/98 |
| 5,815,580 A | | 9/1998 | Craven et al. | |
| 5,892,694 A | * | 4/1999 | Ott | 708/313 |
| 5,929,795 A | * | 7/1999 | Wang | 341/118 |

* cited by examiner

Primary Examiner—Xu Mei
(74) Attorney, Agent, or Firm—Blakely Sokoloff Taylor & Zafman, LLP

(57) ABSTRACT

A digital clipper is highly oversampled to decrease aliasing and increase accuracy. The difference between the clipper's input and output is then downsampled and added to the delayed, unclipped signal at 1× sample rate to achieve clipping. Filters operating at 1× can be placed in series with the downsampled differentially-clipped signal to achieve overshoot compensation, bandlimiting of the clipped signal, and other goals.

16 Claims, 3 Drawing Sheets

OVERSAMPLED DIFFERENTIAL CLIPPER

BACKGROUND OF THE PRESENT INVENTION

1. Field of the Invention

The invention relates to the field of audio signal clipping.

2. Prior Art

Clipping of audio waveforms has proved to be a valuable part of analog audio processing systems designed to reduce the peak-to-average ratio of audio with minimal audible side effects. This technology dates back at least to the 1940s.

When one realizes such a processing system in a sample-data (digital) domain, a number of problems occur that are not present in an analog realization. First is the problem of aliasing. Clipping ordinarily introduces harmonics of the signal not present in the original. The frequency of these harmonics can be higher than the Nyquist frequency, so that they alias back into the baseband. Because the aliased harmonics are generally harmonically unrelated to the frequencies that generated them, such aliased harmonics can be very offensive to the ear.

A further problem occurs when clipping is used to control the peak modulation of an analog transmission channel. Because the digital part of the system is only aware of samples taken from the analog input at certain times, it is highly improbable that any one sample will occur at the peak value of the analog input to such a digital system. While the peak value can be reconstructed from the samples, it must be done by the familiar process of passing each sample through a lowpass filter and observing the output of the lowpass filter in continuous time. Thus, attempting digital-domain clipping by a simple operation that compares each sample to a threshold and replaces the sample value by the threshold when the sample value exceeds the threshold may not work correctly unless the operation is highly oversampled so that it approximates a continuous time system. In this case one can choose the oversampling ratio so that there is guaranteed to be a sample whose value is very close to the peak value of the source analog waveform prior to analog-to-digital (A/D) conversion. A further advantage of oversampling is that it increases the Nyquist frequency so that harmonics caused by the clipping process can be correctly represented and not subject to aliasing. Experiment had shown that 16× oversampling is necessary to reduce errors below 1%.

Oversampling is a very well understood process that is subject to errors. Given sufficient processing power these errors can be reduced to an arbitrarily small magnitude but cannot be entirely eliminated. There is a direct tradeoff between the number of machine cycles used and the quality of the upsampling and downsampling. This is because these processes require filters to remove images caused by the upsampling process, and the flatter the passbands and deeper the stopbands of these filters, the more expensive the filters become. Therefore, if the audio to be processed is subject to oversampling, this process will inevitably distort the frequency response and will also introduce images and aliasing.

SUMMARY OF THE INVENTION

A method and apparatus for digital clipping and other processing of a clipped signal is disclosed. A signal is upsampled and then clipped in a way to provide the "clippings." The "clippings" are lowpass filtered and downsampled. The resultant signal is subtracted from the input signal. Optionally, the downsampled "clippings" can be additionally processed.

DETAILED DESCRIPTION OF THE PRESENT INVENTION

Figure 1:
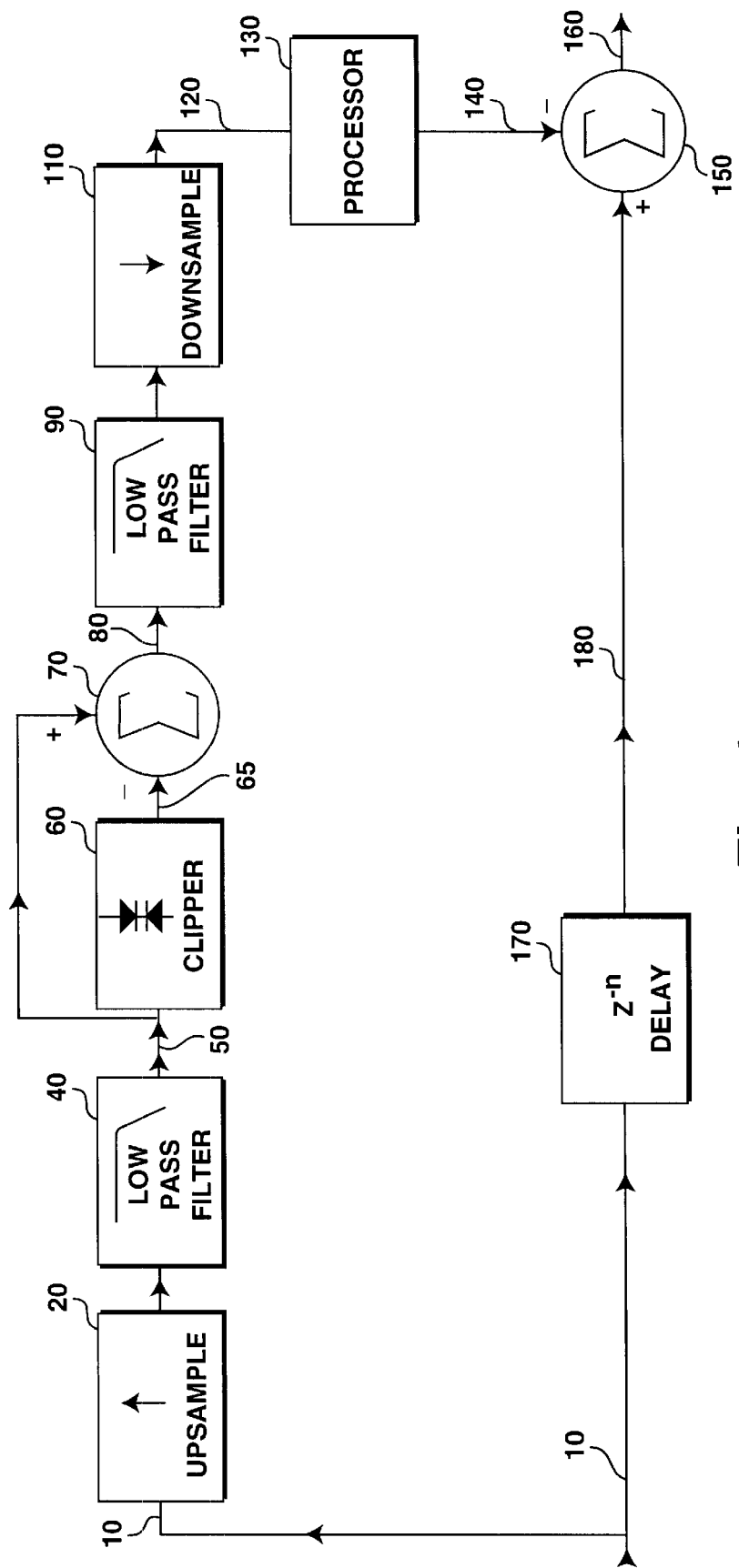
FIG. 1 is a block diagram illustrating one embodiment of the present invention.

A method and apparatus for oversampled differential audio clipping is described. In the following description numerous specific details are set forth such as specific frequencies to provide a thorough understanding of the present invention. It will be apparent to one skilled in the art that the present invention may be practiced without these specific details. In other instances, well-known components and processes such as filtering, are not set forth in detail in order not to obscure the present invention.

OVERVIEW OF THE PRESENT INVENTION

In most audio processing systems the final output must have a lowpass characteristic. This is true of any output intended for broadcast by AM, FM, or digital coding, and of any output intended to be applied to a digital medium. In the case of AM or FM broadcast the audio bandwidth is regulated by the governing authority such as the Federal Communications Commission in the United States, or the ITU-R in Europe. In the case of digital broadcast or other media it is often limited by the Nyquist frequency.

This means that any processing containing clipping must eventually be lowpass filtered to remove the out-of-band components caused by the clipping. In a digital processing system using oversampling, such lowpass filtering occurs as part of the downsampling process, where the aliases caused by downsampling are prevented and the harmonics caused by clipping are removed.

The output of a clipper can be considered to be the sum of two parts: the input signal to the clipper and a signal removed by the clipper to create the final clipped wave, which one might call the "clippings." It is unnecessary to process the first part (the original signal). Instead, only the "clippings" can be passed through the oversampling process. The "clippings" will be automatically band-limited by a downsampling process prior to their addition to the original, unprocessed signal (which is band-limited). Thus adding the "clippings" to the original signal is the same as oversampling the entire signal, clipping it, and downsampling it, except that the original signal is completely unaffected by the oversampling process and therefore is not degraded by it. This means that cheaper filters for upsampling and downsampling can be used than would otherwise be required, because the original signal never passes through these filters.

A further advantage of the present invention occurs when the "clippings" are processed prior to the addition to the original signal. For example, U.S. Pat. No. 4,640,871 ('871 patent) discloses an overshoot protection circuit that compensates for the fact that lowpass-filtering a clipped wave tends to increase the peak level of the wave. The '871 patent teaches that prior to addition to the unclipped signal, the clippings may be applied to a lowpass filter with a rising frequency response before its cutoff frequency. While this could be digitally built using oversampling, the lowpass filter would have to operate at 16×, which would greatly increase its cost. In contrast, the current invention teaches that by applying the downsampled "clippings" to such a lowpass filter, it can instead operate at 1×.

Embodiment of FIG. 1

FIG. 1 shows the invention in a basic form. The sampled audio signal to be clipped is applied to line 10. Upsampler 20 can be a prior art upsampler well-known in the art, although an upsampler that pads the added samples with zeros is preferred because it allows filter 40 to be less costly than it would be if upsampler 20 padded the extra samples with the value of the input sample. As is well-known in the prior art, lowpass filter 40 removes images caused by upsampler 20.

Clipper 60 receives the upsampled output of filter 40. Differencing circuit 70 subtracts the output of clipper 60 (on line 65) from its input on line 50. This implies that the signal on line 80 is zero whenever the clipper is not actively clipping, and therefore, the signal on line 140 (where the downsampled "clippings" appear) is also zero regardless of the quality of the downsampling process. Therefore, when clipper 60 is not operating the quality of the output on line 160 is completely unaffected by the oversampling process.

Downsampling occurs by lowpass filter 90 and downsampler 110 which receives the "clippings" from the circuit 70, as is well-known. Frequency response ripple in the passband of filter 90 affects only the accuracy of the clipping but not the frequency response of the original signal on line 10. Further, the stopband rejection of filter 90 determines the amount of alias rejection and rejection of clipping-induced harmonics but does not affect the original signal on line 10.

The downsampled "clippings" on line 120 can be processed as shown by applying processor 130. For example, processor 130 may be a lowpass filter with a rising frequency response before its cutoff frequency as taught by the '871 patent providing overshoot compensation as taught by the '871 patent. If processor 130 is a highpass filter it removes the difference-frequency intermodulation distortion caused by the clipping processor. If processor 130 is a bandpass filter, it removes the difference-frequency intermodulation distortion caused by the clipping processor and also rolls off harmonics caused by the clipping processor. (See U.S. Pat. No. 4,208,548). Any linear processing in processor 130 needs only to operate at 1× the input sample frequency, and is thus economical.

Filters 40 and 90, and processor 130 have a time delay. To compensate for this delay, the input signal on line 10 is delayed by delay 170 before addition to the "clippings" on line 140 in summing circuit 150. (Note that the "clippings" on line 140 are in fact subtracted from the signal on line 180 to achieve the correct reduction of peak level.) Because filters 40 and 90 may have a delay that is not a integer number of samples at 1×, it may be necessary to insert a short oversampled delay in line 80 to pad the delay of filters 40 and 90 so that their total delay is an integer number of samples at 1×.

Figure 2:
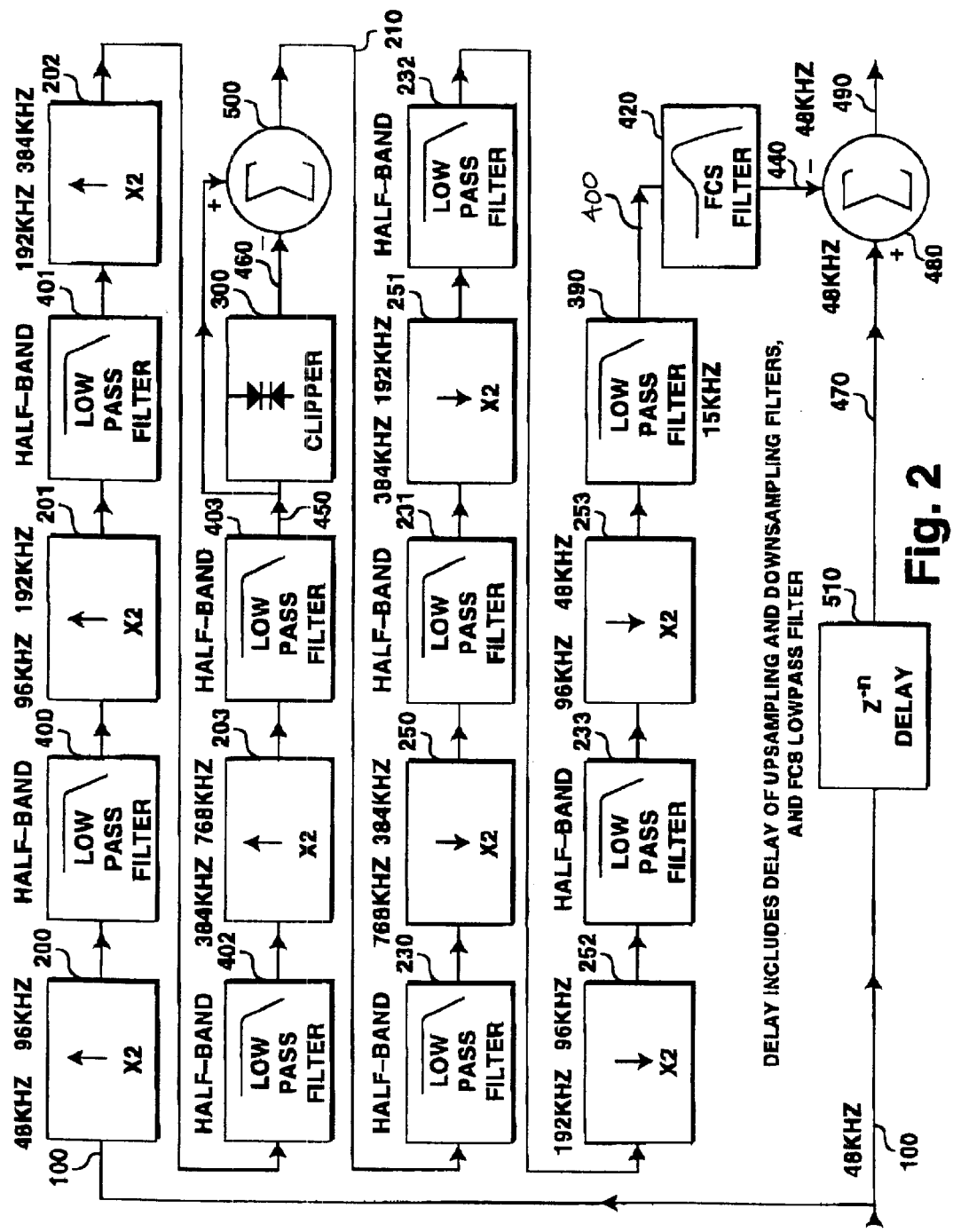
FIG. 2 is a more detailed block diagram of an embodiment of the present invention.

Embodiment of FIG. 2

FIG. 2 shows a commercial, detailed implementation of the present invention. For illustrative purposes, the original sample frequency of 48 kHz is used, although the invention can of course be practiced at other sample frequencies.

The signal to be processed is applied to line 100. It is upsampled 2× by upsampler 200, which inserts a zero between every sample. The image caused by this process is removed by filter 400. This is a half-band, polyphase symmetrical finite impulse response (FIR) filter (as is well-known in the art) to minimize the number of operations necessary to realize the filter while retaining phase linearity. This process is repeated three more times (by upsampler/filter pairs 201/401, 202/402, and 203/403) to create a signal upsampled to 768 kHz sample frequency which is coupled to the clipper 300 and differencing circuit 500 on line 450.

Clipper 300 operates at a 768 kHz-sample frequency. If the sample value on line 450 is greater than the preset positive threshold of clipper 300, it outputs a positive threshold value on line 460. If the signal on line 450 is less than the preset negative threshold value of clipper 300, it outputs a negative threshold value. If neither is true, it outputs the input sample from line 450. Because of the high amount of oversampling, aliases of clipping-induced harmonics are typically more than 75 dB below full-scale in the 0 to 15 kHz baseband.

Differencing circuit 500 subtracts the clipper's output from its input, applying the difference to line 210. This "clippings" signal is then downsampled to 48 kHz by a series of four decimator/filter pairs: 230/250, 231/251, 232/252, and 233/253. The filters are all polyphase halfband symmetrical FIR filters to minimize cost while preserving phase linearity.

Because filter 233 is half-band, it allows a small amount of aliasing, since half-band filters are down 6 dB at one-half of the Nyquist frequency. In this particular case, the Nyquist frequency is 48 kHz, so part of the transition band of the filter extends slightly above 24 kHz and upon decimation by 2× in decimator 253 will fold around 24 kHz. Lowpass filter 390 removes this alias energy and also band-limits the "clippings" signal to 15 kHz, making it suitable for transmission by the world standard "pilot tone" FM stereo system. Lowpass filter 390 is neither polyphase nor half-band. But, because it operates at 48 kHz-sample frequency, it is maximally economical.

Filter 420, which is optional, is inserted in line 400 to allow the system to practice the teaching of the '871 patent. This filter is a fifth-order infinite impulse response (IIR) filter with a sixth-order allpass group delay corrector, which is calculated to make the group delay of the cascaded filter and corrector approximately constant between 0 and 15 kHz. If filter 420 were omitted, the system in FIG. 2 would be equivalent to an oversampled clipper and would overshoot because of the bandlimiting applied to the clipper's output.

The original signal on line 100 is applied to delay 510, whose delay is equal to the sum of the delays of filters 400, 401, 402, 403, 230, 231, 232, 233, 390 and 420. If the required delay is not an integer number of samples at 48 kHz, a short delay line of less than 16 samples (operating at 768 kHz) can be inserted in line 450 or line 210 to make the overall delay integer at 48 kHz.

The processed "clippings" on line 440 are subtracted from the delayed original signal in subtracting circuit 480. The difference between the two signals is the peak-controlled output of the system, and is found on line 490.

Figure 3:
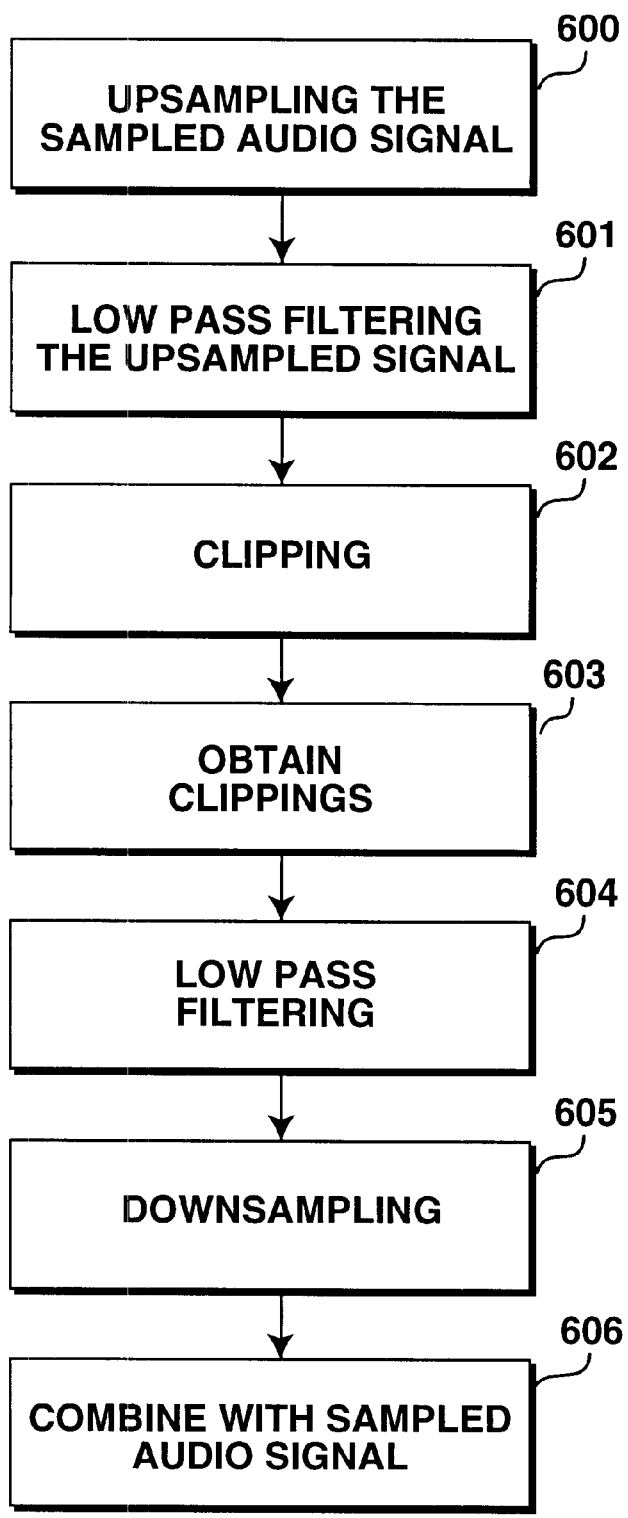
FIG. 3 illustrates the steps in the method of the present invention.

Method of FIG. 3

The method of the present invention is illustrated in FIG. 3 starting with step 600. As illustrated by this step, the sampled audio signal is upsampled. This step is performed in FIG. 1 by the upsampling circuit 20 and in FIG. 2 by the upsamplers 200, 201, 202 and 203. Following the upsampling, lowpass filtering occurs for each of the upsamplers. This, as shown by step 601 in FIG. 3, is accomplished by the lowpass filter 40 of FIG. 1 and by the lowpass filters 400–403 for the embodiment of FIG. 2.

As shown by step 602, the digital clipping occurs. Following this the "clippings" are obtained as shown by step 603. This is performed in FIG. 1 by the clipper 60 in combination with the combining circuit 70. Similarly, in FIG. 2 this is performed by the clipper 300 in conjunction with circuit 500.

As taught by the present invention, operations occur on the "clippings" themselves. As shown by step 604, the "clippings" may be, for instance, passed through a lowpass filter and then downsampled as shown by step 605. This is performed by the filter 90 and downsampling circuit 110 of FIG. 1 and the filter downsampling circuit pairs 230/250; 231/251; 232/252 and 233/253 of FIG. 2. Additional processing may occur although not specifically shown in FIG. 3 as taught by the '871 patent. This processing is shown by processor 130 of FIG. 1 and the lowpass filter 390 of FIG. 2.

As shown by step 606, the clippings are subtracted from the delayed input audio signal.

Thus, an improved oversampled differential clipping system and method has been described. By operating on the oversampled "clippings," reduced cost and higher quality are achieved by comparison to a system where the entire unprocessed signal is upsampled, clipped, and then downsampled. The embodiment of FIG. 2 is particularly economical and efficient by its use of cascaded 2× interpolators and decimators interleaved with polyphase half-band FIR filters. In addition to the specific application shown in FIG. 2, the present invention can also be used within any system in which a conventional audio clipper is used and where the system is realized by digital signal processing. Three examples of systems containing such clippers are the systems described in U.S. Pat. No. 4,292,042; U.S. Pat. No. 4,412,100; and U.S. Pat. No. 5,168,526.

I claim:

1. A method for digital clipping a signal comprising:
   oversampling the signal;
   clipping the oversampled signal;
   subtracting the clipped oversampled signal from the oversampled signal to provide oversampled clippings;
   downsampling the clippings; and
   combining the downsampled clippings with the signal.

2. The method defined by claim 1 including delaying the signal before it is combined with the downsampled clippings.

3. The method defined by claim 2 including lowpass filtering the oversampled signal prior to the clipping step.

4. The method defined by claim 3 including processing the oversampled clippings with lowpass filtering.

5. The method defined by claim 1 or 4 including lowpass filtering the downsampled clippings to provide overshoot compensation.

6. The method defined by claim 1 or 4 including highpass filtering of the downsampled clippings.

7. The method defined by claim 1 or 4 including bandpass filtering of the downsampled clippings.

8. A digital clipper comprising:
   a plurality of upsampler/filter pairs each comprising an upsampler and a lowpass filter, the upsampler/filter pairs being coupled in series with the first upsampler/filter pair in the series receiving an input signal;
   a clipper and first differencing circuit, coupled to the last of the series coupled upsampler/filter pairs, an output of the first differencing circuit being signals representing clippings;
   a plurality of filter/downsampler pairs coupled in series, with the first filter/downsampler pair receiving the clippings from the first differencing circuit; and
   a second differencing circuit coupled to the last in the series of filter/downsampler pairs and also coupled to receive the input signal.

9. The clipper defined by claim 8 including a delay element for delaying the input signal before it is received by the second differencing circuit.

10. The clipper defined by claim 8 or 9 including a lowpass filter coupled between the filter/downsampler pairs and the second differencing circuit.

11. The clipper defined by claim 8 or 9 including a highpass filter coupled between the filter/downsampler pairs and the second differencing circuit.

12. The clipper defined by claim 8 or 9 including a bandpass filter coupled between the filter/downsampler pairs and the second differencing circuit.

13. The clipper defined by claim 8 wherein the filters of the upsampler/filter pairs each comprise a polyphase half-band FIR filter.

14. The clipper defined by claim 13 wherein the upsamplers of the upsampler/filter pairs each comprise a 2X upsampler.

15. The clipper defined by claim 8 or 13 wherein the filters of the filter/downsampler pairs each comprise polyphase half-band FIR filters.

16. The clipper defined by claim 15 wherein the downsamplers each are X2 downsamplers.

* * * * *